US009516786B2

(12) United States Patent
Lan et al.

(10) Patent No.: US 9,516,786 B2
(45) Date of Patent: Dec. 6, 2016

(54) ELECTRIC EQUIPMENT AND AIR CONDITIONER

(71) Applicant: Toshiba Carrier Corporation, Kawasaki-Shi, Kanagawa (JP)

(72) Inventors: Tian Lan, Fuji (JP); Kenji Gajina, Fuji (JP)

(73) Assignee: TOSHIBA CARRIER CORPORATION, Kanagawa (JP)

( * ) Notice: Subject to any disclaimer, the term of this patent is extended or adjusted under 35 U.S.C. 154(b) by 205 days.

(21) Appl. No.: 14/381,552

(22) PCT Filed: Feb. 25, 2013

(86) PCT No.: PCT/JP2013/054725
§ 371 (c)(1),
(2) Date: Aug. 27, 2014

(87) PCT Pub. No.: WO2013/129300
PCT Pub. Date: Sep. 6, 2013

(65) Prior Publication Data
US 2015/0009626 A1    Jan. 8, 2015

(30) Foreign Application Priority Data

Feb. 28, 2012  (JP) ................................. 2012/040993
Mar. 21, 2012  (JP) ................................. 2012/063028

(51) Int. Cl.
*H01L 23/36*   (2006.01)
*H05K 7/20*    (2006.01)
(Continued)

(52) U.S. Cl.
CPC ......... *H05K 7/20154* (2013.01); *F24F 1/0007* (2013.01); *F24F 1/24* (2013.01);
(Continued)

(58) Field of Classification Search
CPC ............ H05K 7/20154; H05K 7/20418; H05K 7/2039; H05K 7/20163; F24F 1/24; F24F 1/0007; F24F 2001/0037; F24F 2013/207; H01L 23/36; H01L 2924/0002
See application file for complete search history.

(56) References Cited

U.S. PATENT DOCUMENTS 3,226,602 A  * 12/1965  Elfving ................... F25B 21/02
                                                    165/170
4,522,566 A     6/1985  Deininger
(Continued)

FOREIGN PATENT DOCUMENTS

| JP | S63-290337 | 11/1988 |
| JP | H04-344034 | 11/1992 |

(Continued)

OTHER PUBLICATIONS

International Search Report issued in PCT/JP2013/054725 dated May 14, 2013.
(Continued)

*Primary Examiner* — Adam B Dravininkas
(74) *Attorney, Agent, or Firm* — DLA Piper LLP (US)

(57) ABSTRACT

An electric equipment includes: an electric component box; a control board accommodated in the electric component box and provided thereon with a heat-generating electric component; a heat sink thermally connected with the electric component; and a sheet material provided between the electric component box and the control board, wherein the sheet material is made of an elastic material and provided with an opening section through which the heat sink projects outward, the opening section is provided with a convex section formed integrally with the sheet material and configured to be elastically deformed to engage the sheet material with the heat sink, and the electric component box is provided with a heat sink hole through which the heat sink (Continued)

and the convex section project outward of the electric component box. An air conditioner is provided with such electric equipment.

9 Claims, 7 Drawing Sheets

(51) Int. Cl.
    *F24F 1/00*     (2011.01)
    *F24F 1/24*     (2011.01)
    *F24F 13/20*     (2006.01)

(52) U.S. Cl.
    CPC ....... *H05K 7/2039* (2013.01); *H05K 7/20163* (2013.01); *H05K 7/20418* (2013.01); *F24F 2001/0037* (2013.01); *F24F 2013/207* (2013.01); *H01L 23/36* (2013.01); *H01L 2924/0002* (2013.01)

(56) References Cited

U.S. PATENT DOCUMENTS

| | | | |
|---|---|---|---|
| 4,549,792 A | | 10/1985 | Dianitsch |
| 4,621,304 A | | 11/1986 | Oogaki et al. |
| 4,709,560 A | * | 12/1987 | Voorhis .............. H05K 7/20154 165/125 |
| 5,440,172 A | * | 8/1995 | Sutrina ............... H01L 23/3737 257/712 |
| 6,999,317 B2 | | 2/2006 | Chengalva et al. |
| 2003/0164357 A1 | * | 9/2003 | Hedberg .............. B23K 9/1006 219/98 |
| 2005/0036292 A1 | | 2/2005 | Chengalva et al. |
| 2006/0105142 A1 | * | 5/2006 | Shiga ...................... C09J 7/026 428/136 |
| 2007/0164621 A1 | | 7/2007 | Kano et al. |
| 2009/0025413 A1 | | 1/2009 | Koga et al. |

FOREIGN PATENT DOCUMENTS

| | | |
|---|---|---|
| JP | H06-109278 | 4/1994 |
| JP | 2001-160607 | 6/2001 |
| JP | 2004-274018 | 9/2004 |
| JP | 2006-135239 | 5/2006 |
| JP | 2006-143797 | 6/2006 |
| JP | 2008-95979 | 4/2008 |
| JP | 2009-30829 | 2/2009 |
| JP | 2009-98248 | 5/2009 |
| JP | 2009-99677 | 5/2009 |
| JP | 2010-7970 | 1/2010 |
| WO | WO 2005/060075 | 6/2005 |

OTHER PUBLICATIONS

English Language Translation of International Search Report issued in PCT/JP2013/054725 dated May 14, 2013.
English Language Translation of International Preliminary Report on Patentability issued in PCT/JP2013/054725 dated Sep. 2, 2014.
English Language Translation for Written Opinion of the International Searching Authority issued in PCT/JP2013/054725 dated May 14, 2013.
English Language Translation of Written Opinion of the International Searching Authority issued in PCT/JP2013/054725 dated May 14, 2013.
English Language Abstract and Translation for JP 2010-007970 published Jan. 14, 2010.
English Language Abstract and Translation for JP 2006-135239 published May 25, 2006.
English Language Abstract and Translation for JP H06-109278 published Apr. 19, 1994.
English Abstract for S63-290337 published Nov. 28, 1988.
English Language Abstract for H04-344034 published Nov. 30, 1992.
English Language Abstract and Translation for JP 2009-030829 published Feb. 12, 2009.
English Language Abstract and Translation for JP 2006-143797 published Jun. 8, 2006.
English Language Abstract and Translation for JP 2008-095979 published Apr. 24, 2008.
English Language Abstract and Translation for JP 2004-274018 published Sep. 30, 2004.
English Language Abstract and Translation for JP 2009-099677 published May 7, 2009.
English Language Abstract and Translation for JP 2001-160607 published Jun. 12, 2001.
English Language Abstract and Translation for JP 2009-098248 published May 7, 2009.
Japanese Office Action issued in JP 2014-502200 dated Mar. 3, 2015.

* cited by examiner

ELECTRIC EQUIPMENT AND AIR CONDITIONER

CROSS REFERENCE TO RELATED APPLICATIONS

This application is a U.S. National Stage Application of International Application No. PCT/JP2013/054725 filed Feb. 25, 2013, which claims priority from Japanese Patent Application No. 2012/040993 filed Feb. 28, 2012 and Japanese Patent Application No. 2012/063028 filed Mar. 21, 2012. The entirety of all the above-listed applications are incorporated herein by reference.

TECHNICAL FIELD

The present invention relates to an electric equipment having a cooling structure and an air conditioner provided with the electric equipment.

BACKGROUND ART

Conventionally, there is known a so-called built-in type air conditioner in which an air conditioner main body is installed in the ceiling, for example, of a room to be air-conditioned, and the air having been subjected to heat exchange with a heat exchanger accommodated in the air conditioner main body is supplied to the room to be air-conditioned (called "air-conditioned room" hereinlater) via a blow-out duct.

The air conditioner of this type includes, in addition to the heat exchanger and a blower, an electric (or electrical) component box in which electric (or electrical) components or parts such as a printed board (a control board or a circuit board) with electronic components or parts mounted thereon are accommodated. The electric components in the electric component box generate heat when the air conditioner operates, and it is hence necessary to cool these electric components.

To cool the electric components, it might be possible to adopt a configuration in which a plurality of vent holes are provided in the electric component box so as to cool the inside of the electric component box. However, when a fire occurs in the electric component box, the fire may spread to the air conditioner main body and the building materials in the ceiling through the vent holes. On the other hand, when the electric component box is configured as a sealed structure in order to prevent the spread of the fire from the electric component box, the heated electric components is cooled insufficiently, which may cause failures in or malfunctioning of the electric components.

Further, there is a case where, in order to promote cooling of the inside of the electric component box, a cooling structure is adopted in which a plurality of vent holes are provided in the electric component box, or in which a hole is provided in the electric component box so that a cooling member such as a heat sink is arranged to project outward from the inside of the electric component box.

In such a case, in a known configuration, a sheet material is provided to close a gap formed between the heat sink and the hole provided in the electric component box.

In the structure described above, since the temperatures of the heat sink and the electric component box become high, the sheet material provided in the manner mentioned above is not stuck or bolt-fixed to the heat sink and the electric component box, and hence, easily falls off during assembly or maintenance. Thus, this may result in deterioration of workability and insufficient cooling of the heat-generating electric components and eventually may result in failure or malfunction of the electric components.

PRIOR ART DOCUMENTS

Patent Document

Patent Document 1: Japanese Patent Laid-Open Publication No. 2009-30829

SUMMARY OF THE INVENTION

Problems to be Solved by the Invention

The present invention was conceived in consideration of the circumstances mentioned above, and an object thereof is to provide an electric equipment and an air conditioner in which electric components or parts accommodated in an electric component box can be cooled, and the spread of fire from the electric component box can be prevented. In addition, the assembly work and maintenance work can be easily performed.

Means for Solving the Problems

According to an aspect of the present invention, the above-described object can be achieved by providing an air conditioner including a blower, a heat exchanger, and an electric component box, wherein the electric component box is provided with a heat sink attached at a position opposing to the blower and a heat sink hole through which the heat sink projects outward of the electric component box.

According to the above aspect of the embodiment, the following structure may be desired.

It may be desired that the electric component box is formed with a cut-and-raised piece having a projection length larger than a projection length of the heat sink at a peripheral portion of the heat sink hole.

It may be desired that the electric component box is provided, to a surface in which the heat sink hole is formed, with a resin molded-component having projection length larger than a projection length of the heat sink.

It may be desired that the air conditioner is a built-in type air conditioner.

According to another aspect of the present invention, there is provided an electric equipment comprising: an electric component box; a control board accommodated in the electric component box and provided thereon with a heat-generating electric component; a heat sink thermally connected with the electric component; and a sheet material provided between the electric component box and the control board, wherein the sheet material is made of an elastic material and provided with an opening section through which the heat sink projects outward, the opening section is provided with a convex section formed integrally with the sheet material and configured to be elastically deformed to engage the sheet material with the heat sink, and the electric component box is provided with a heat sink hole through which the heat sink and the convex section project outward of the electric component box.

In the above aspect of the embodiment, it may be desired that an H-shaped slit is formed to a position of the opening section of the sheet material in a state before the sheet material is assembled into the electric equipment.

It may be further desired that the sheet material is formed of a flame-retardant material which has a large surface friction coefficient and is elastically deformable.

It may be further desired that the sheet material is an aramid paper.

In addition, according to the present embodiment, there is also provided an air conditioner provided with the electric equipment of the structure mentioned above.

Effects of the Invention

According to the above-described aspects of the present invention, even in a case where a fire occurs in the electric component box in the air conditioner, the fire can be prevented from spreading to the air conditioner main body and a building materials in a ceiling of the air conditioner through a vent hole, and furthermore, since an electric component which may generate heat in a sealed structure can be sufficiently cooled, any failure and malfunction of the electric component can be prevented.

Further, in the case where there is adopted a configuration or structure in which a sheet material is provided to close a gap formed between the heat sink and the hole formed in the electric component box in order to promote cooling of the inside of the electric component box, the sheet material is formed of an elastic material, and also a convex section, which is elastically deformed so as to engage or lock the sheet material to the heat sink, is formed integrally with the sheet material. According to this configuration, the transfer of heat to the heat sink which becomes high temperature is suppressed by the sheet material, and the heat-generating electric component can be sufficiently cooled. It is therefore possible to prevent any failure or malfunction of the electric component from occurring.

BRIEF DESCRIPTION OF THE DRAWINGS

FIG. 4 is a perspective view showing an entire electric component box of the air conditioner shown in FIG. 1, in which

FIG. 5 is an external perspective view showing a state in which the electric component box shown in FIG. 4 is attached to the air conditioner, in which

EMBODIMENT FOR CARRYING OUT THE INVENTION

In the following, embodiments according to the present invention will be described with reference to the accompanying drawings.

It should be noted that the present embodiment is described about a built-in type air conditioner as an air conditioner provided with an electric equipment.

FIGS. 1 to 6 show a first embodiment of the present invention.

Figure 1A:
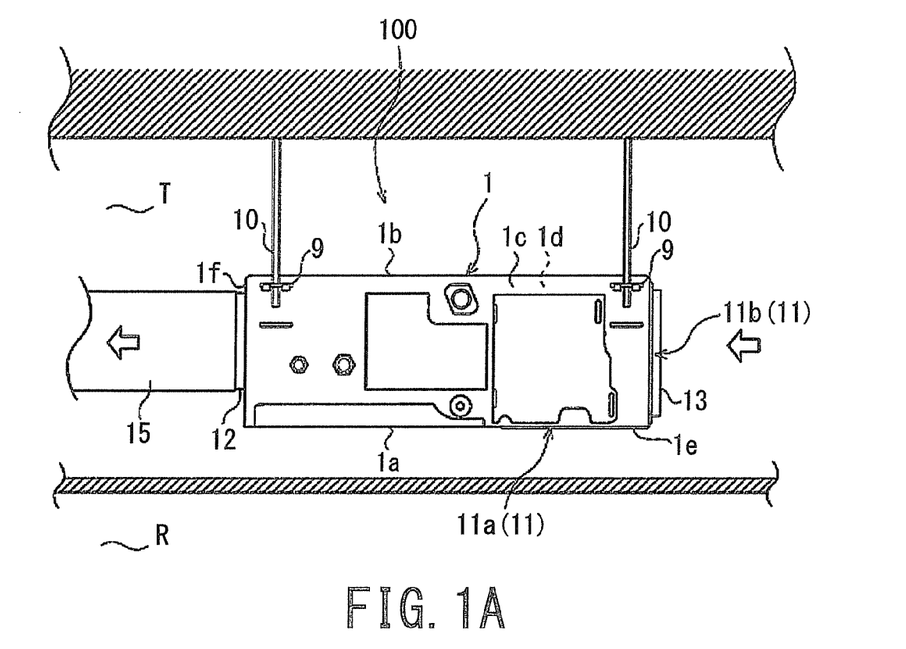
FIG. 1A and FIG. 1B are side views showing an installation state of an air conditioner according to an embodiment of the present invention.
Figure 1B:
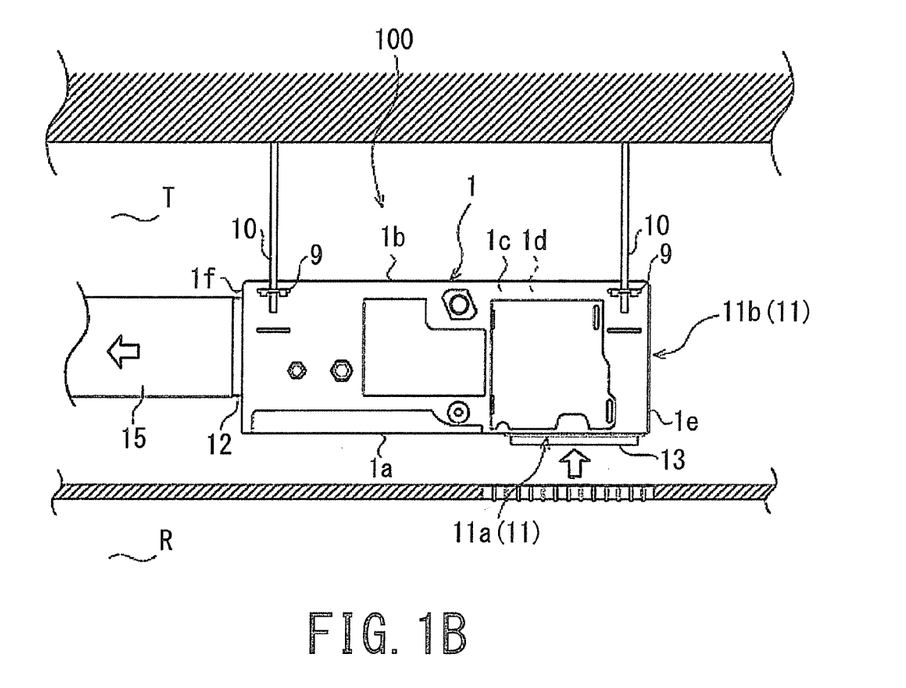

FIG. 1A is a side view showing an installation state of a built-in type air conditioner 100 at the time when air in a ceiling T is sucked from the rear surface portion of a main body 1. FIG. 1B is a side view showing an installation state of the built-in type air conditioner 100 at the time when air in the ceiling T is sucked from a lower surface portion of the main body 1.

The main body 1 of the built-in type air conditioner 100 is installed in the ceiling T in such a manner that hook metal fittings 9, each pair of which is provided at both side surfaces of the main body 1, are respectively fixed with nuts or the like to hook bolts 10 vertically suspended from a beam member in the ceiling T of an air-conditioned room R.

An air blow-out port 12 is provided at a front section 1f of the main body 1, and at least one or more blow-out ducts 15 are connected to the air blow-out port 12. The blow-out duct 15 is made to communicate with one or more ceiling blow-out ports, not shown, which are provided in the ceiling surface of the air-conditioned room R. That is, the inside of the air-conditioned room R can be air-conditioned in such a manner that heat-exchanged air led out from the main body 1 is made to pass through the blow-out duct 15 and is blown out from the ceiling blow-out ports into the air-conditioned room R. It should be noted that, in the case where the air-conditioned room R is large, the ceiling blow-out ports are provided at distributed locations so that the inside of the air-conditioned room R is uniformly air-conditioned.

Figure 2:
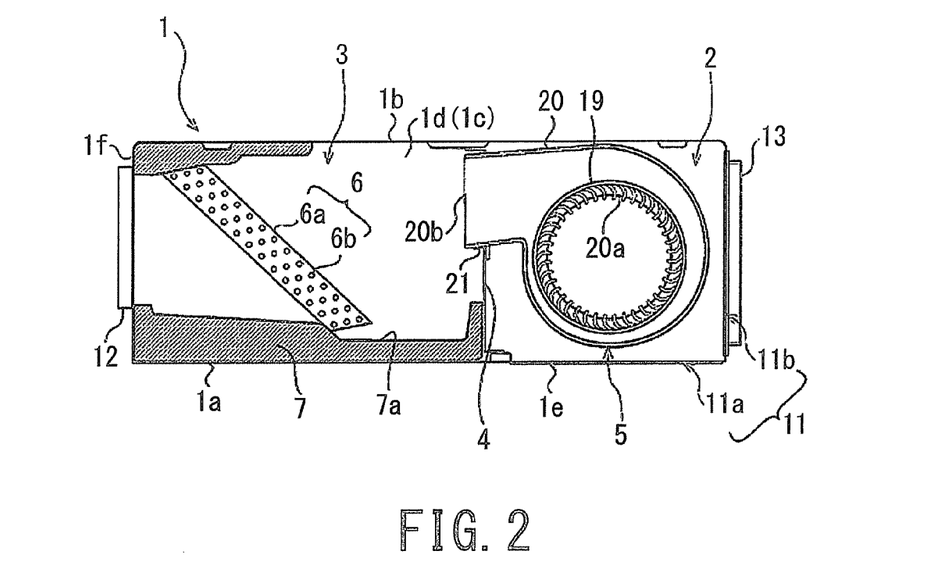
FIG. 2 is a longitudinal sectional view of the air conditioner shown in FIG. 1.

FIG. 2 is a sectional view of the built-in type air conditioner in the present embodiment.

The main body 1 is formed to have a thin rectangular box shape in which the dimension in the height direction is shorter than the dimension in the width direction (the front-rear direction on the paper surface) and the dimension in the depth direction (the left-right direction on the paper surface).

In the main body 1, a partition plate 4, which partitions the main body 1 into a blower chamber 2 and a heat exchange chamber 3, is provided across the width direction of the main body 1.

In the main body 1, the lower surface portion of the heat exchange chamber 3 is composed of a bottom plate 1a, the lower surface portion of the blower chamber 2 is composed of a wind shield plate 1e, the upper surface portion is composed of a top plate 1b, the side surface portion on the front side is composed of a side surface plate 1c, and the side surface portion on the depth side is composed of a side surface plate 1d. Each of the plates 1a to 1e is formed by processing a thin metal plate.

The air blow-out port 12 is provided at the front section 1f of the main body 1, and a dust collecting filter 13 is attached to the rear surface portion of the main body 1 so as to cover an air suction port 11b.

A blower 5 is arranged in the blower chamber 2, and a heat exchanger 6 and a drain pan 7 are arranged in the heat exchange chamber 3.

An air suction port 11 which sucks air in the ceiling T into the main body 1 is provided in the blower chamber 2. The air suction port 11 is composed of an air suction port 11a provided at the lower surface portion and the air suction port 11b provided at the rear surface portion. That is, the air suction ports 11a and 11b are preliminarily formed to the lower surface portion and the rear surface portion of the main body 1. According to the situation of an installation site, one of the air suction ports 11a and 11b is selected, and the other of the air suction ports 11a and 11b is closed by the shield plate 1e.

In the case where air is sucked from the rear surface portion as shown in FIG. 1A, the dust collecting filter 13 is attached to the air suction port 11b formed in the rear surface portion, and the air suction port 11a formed in the lower surface portion is closed by the shield plate 1e. On the other hand, in the case where air is sucked from the lower surface portion as shown in FIG. 1B, the dust collecting filter 13 is attached to the air suction port 11a formed in the lower surface portion, and the air suction port 11b formed in the rear surface portion is closed by the shield plate 1e.

Figure 3:
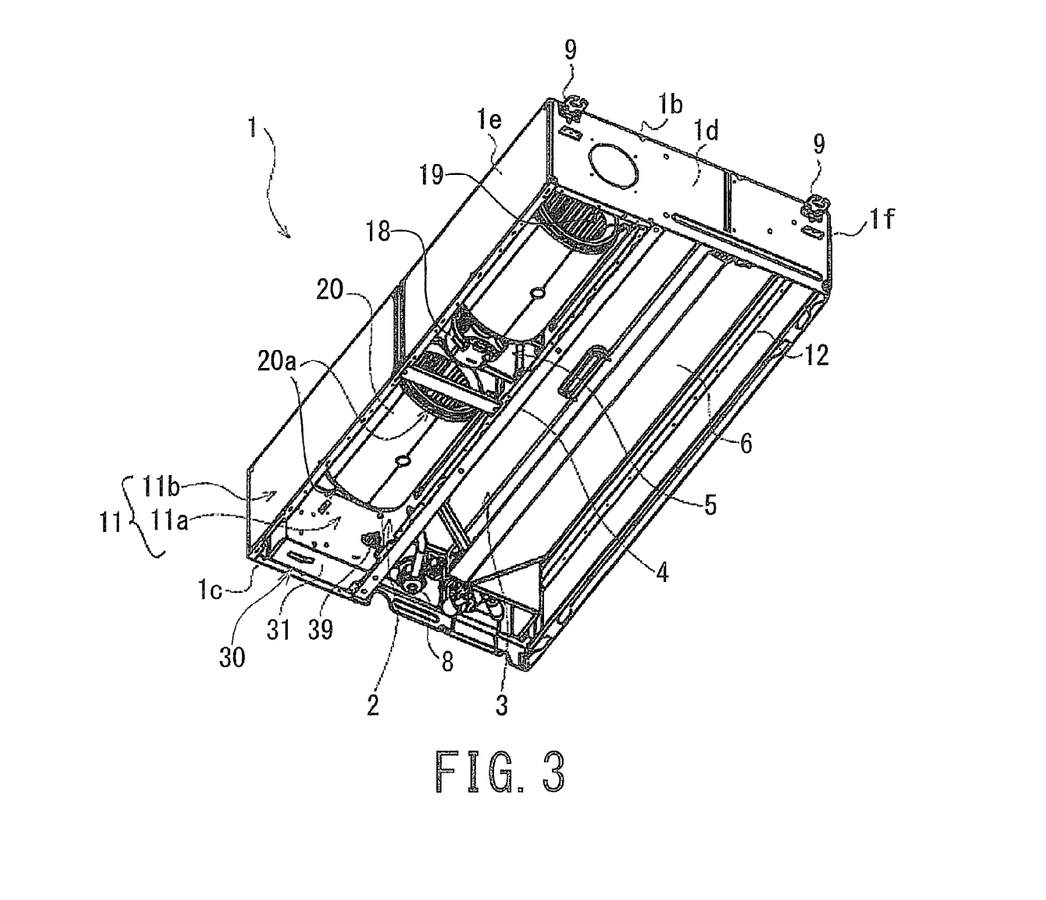
FIG. 3 is an external perspective view when the air conditioner shown in FIG. 1 is seen from the lower side.

FIG. 3 is an external perspective view when the built-in type air conditioner shown in FIG. 1 is seen from the lower side, in which the inside of the main body 1 is shown by removing the bottom plate 1a, the drain pan 7, and the wind shield plate 1e shown in FIG. 2.

The blower 5 accommodated in the blower chamber 2 is provided with a fan motor 18 at the shaft-direction central portion thereof, and the fan motor 18 is a two-shaft motor with rotary shafts respectively projecting from the both side portions thereof. A fan (a so-called multi-blade fan) 19 of a type, in which air is sucked, according to the rotation thereof, from the shaft direction and blown out in the circumferential direction, is connected to each of the rotating shafts, and further each of the fans 19 is accommodated in a fan casing 20.

A suction port 20a for sucking air is formed in each of both side surfaces of the fan casing 20, and a blow-off nozzle 20b is formed at an end portion of the fan casing 20 on the side of the partition plate 4 as shown in FIG. 2. The blow-off nozzle 20b is made so as to project toward the side of the heat exchange chamber 3 via a communication port 21 which is formed in the partition plate 4. Accordingly, the air blown out from the blower 5 is sent to the side of the heat exchange chamber 3.

The heat exchanger 6 arranged in the heat exchange chamber 3 is a fin tube-type heat exchanger configured such that, as shown in FIG. 2, an end plate, not shown, is arranged at each of both side end portions of the heat exchanger 6, such that, between the end plates, a plurality of aluminum fins 6a are provided in parallel with each other with a predetermined distance therebetween, and such that a plurality of heat transfer tubes 6b are provided so as to penetrate both the end plates and the aluminum fins 6a.

The heat exchanger 6 is mounted on the drain pan 7 so as to have a posture in which the vertical direction of the heat exchanger 6 is obliquely inclined. Accordingly, a necessary heat exchange area can be secured in the state in which the heat exchanger 6 is accommodated in the thin main body 1.

Further, a heat insulating material is provided at the periphery of the heat exchanger 6 and on the side of the air blow-out port 12 of the heat exchanger 6 in the heat exchange chamber 3.

The drain pan 7 receives drain water generated by the heat exchanging operation of the heat exchanger 6 during the cooling operation, and accumulates the drain water in a drain receiving section 7a. A drain pump 8 (FIG. 3) is provided above the drain receiving section 7a, and the drain water accumulated in the drain receiving section 7a is discharged to the outside of the main body 1 by the drain pump 8.

A substantially entire area of the lower surface of the drain pan 7 is covered by the bottom plate 1a constituting the lower surface portion of the main body 1.

Next, an electric equipment 30 arranged in the fan chamber 2 will be described.

Figure 4A:
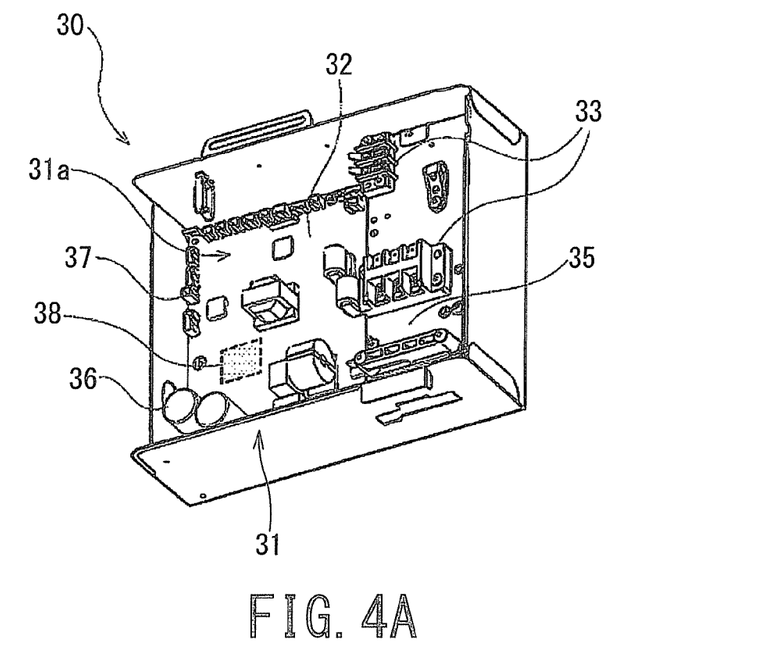
FIG. 4A is a perspective view when the electric component box is seen from the front surface side.
Figure 4B:
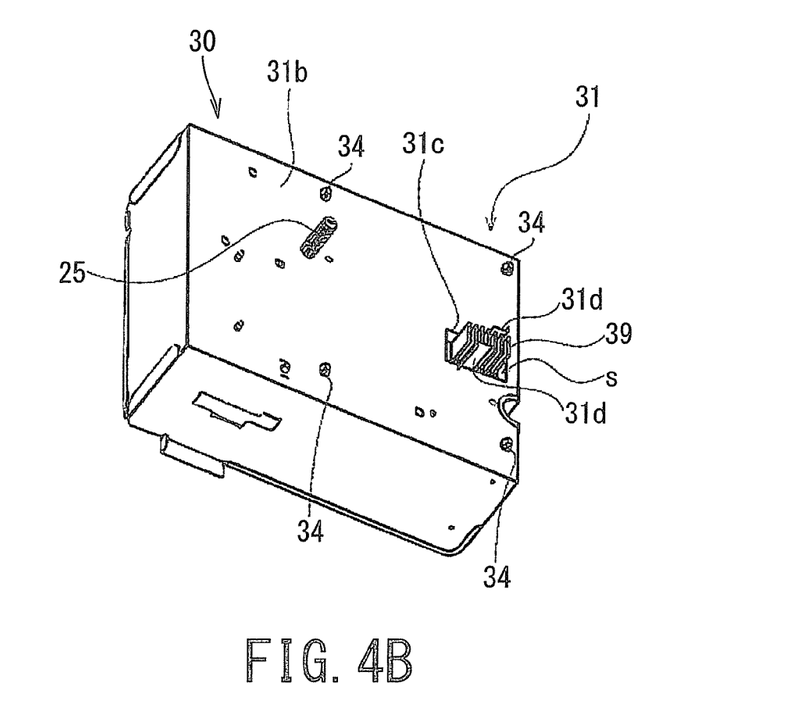
FIG. 4B is a perspective view when the electric component box is seen from the rear surface side.
Figure 5A:
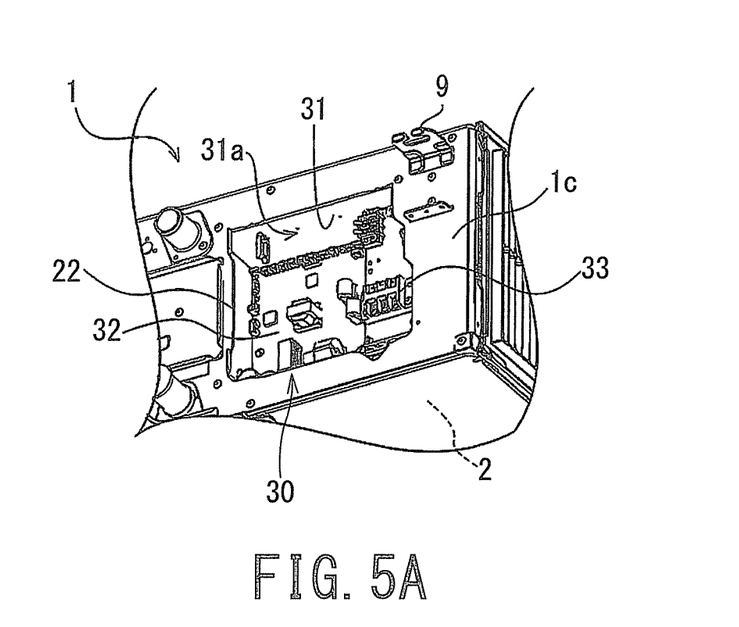
FIG. 5A shows a state in which the electric component box is attached to the air conditioner main body.
Figure 5B:
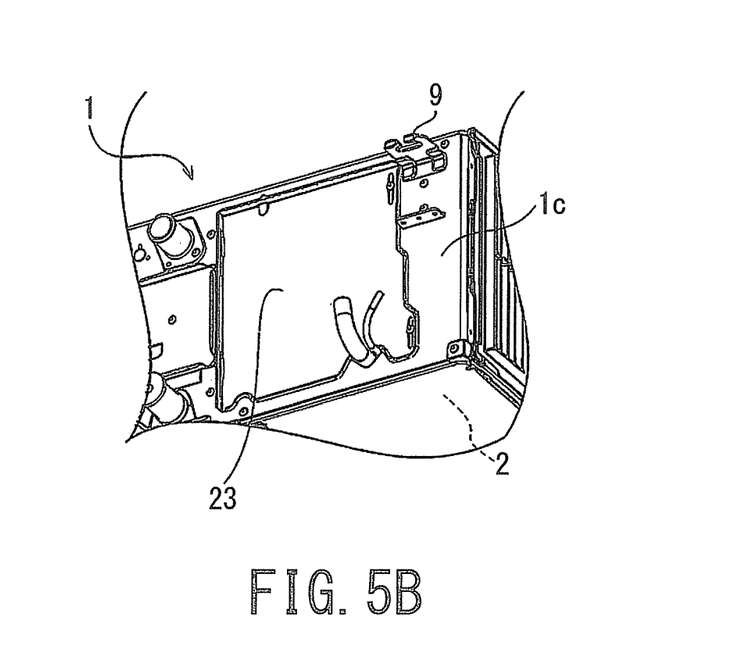
FIG. 5B shows a state in which a cover is provided in FIG. 5A.
Figure 6:
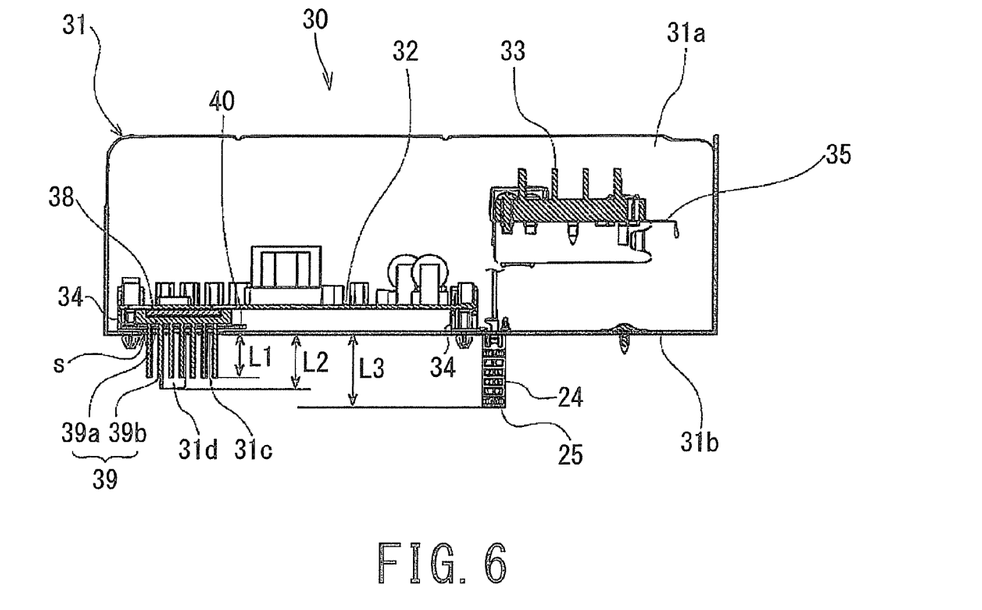
FIG. 6 is a schematic cross-sectional view along the lateral direction (the left-right direction on the paper surface of the drawing) of the electric component box shown in FIG. 4B.

The electric equipment 30 includes an electric component box 31 in which various kinds of electric components are incorporated. FIG. 4A is a perspective view when the electric component box 31 is seen from the front surface side, and FIG. 4B is a perspective view when the electric component box 31 is seen from the rear surface side. FIG. 5A is a perspective view showing a state in which the electric component box 31 is attached to the main body 1, and FIG. 5B is a perspective view showing a state in which a cover 23 is attached in FIG. 5A. Further, FIG. 6 is a schematic cross-sectional view along the lateral (left-right) direction on the paper surface of the electric component box 31 shown in FIG. 4B.

The electric component box 31 is formed by bending a metal thin plate, and is formed, as shown in FIG. 4, into a box body shape which includes an opening section 31a formed in the front surface, a bottom plate 31b formed to face the opening section 31a, and side plates formed at upper and lower side portions and left and right side portions of the bottom plate 31b.

As shown in FIG. 3, the electric component box 31 is arranged at the inner surface side of the side surface plate 1c forming the main body 1 and faces the suction port 20a provided in the fan casing 20 in the blower chamber 2.

On the other hand, as shown in FIG. 5A, an opening section 22 for maintenance is provided in the side surface plate 1c of the main body 1. In a state in which the electric component box 31 is attached in the blower chamber 2, the maintenance opening section 22 faces the opening section 31a of the electric component box 31, so that the inside of the electric component box 31 is made to communicate with the outside of the main body 1.

As shown in FIG. 5B, the maintenance opening section 22 is usually covered with the cover 23 made of a metal thin plate from the outside of the main body 1. By the location of such cover 23, dust is prevented from entering the inside of the electric component box 31, and the airtightness in the electric component box 31 is maintained. It should be noted that, when it is necessary to perform the maintenance of the electric component box 31 from the outside of the main body 1, the cover 23 shown in FIG. 5B is removed, and then maintenance work is performed.

As shown in FIG. 5A, in the inside of the electric component box 31, a control board 32 and a terminal block 33 are arranged to face the opening section 31a (i.e., maintenance opening section 22).

As shown in FIG. 4 and FIG. 6, the control board 32 is attached to the inner side of the bottom plate 31b of the electric component box 31 by a fixing device 34 made of a resin-molded component also serving as a spacer. The control board 32 is attached to the bottom plate 31b via a gap which is provided in order to maintain an insulation distance between the control board 32 and the bottom plate 31b.

Electric wires extending from a remote controller and an outdoor unit, both not shown, are connected to the terminal block 33. The terminal block 33 is attached to a support plate 35, which is provided at a substantially intermediate position between the opening section 31a and the bottom plate 31b of the electric component box 31 so as to vertically extend over the inside of the electric component box 31. The terminal block 33 is arranged close to the maintenance opening section 22 by means of the support plate 35, and hence, it is possible to easily perform the work of connecting the electric wires to the terminal block 33.

A room temperature sensor 24 for detecting the temperature of air sucked into the blower chamber 2, and a heat exchanger temperature sensor, not shown, for detecting the temperature of the heat exchanger 6 are connected to the control board 32.

Further, on the control board 32, there is formed a control circuit such as a memory which stores therein control programs for controlling the operation of the blower 5, the drain pump 8, and the like in response to the temperatures detected by the temperature sensors and in response to commands from the remote controller and the outdoor unit.

As shown in FIG. 4A, a plurality of electrolytic capacitors 36, connectors 37, and the like, are mounted on the surface of the control board 32, which surface is located on the side of the opening section 31a, while a power module 38 for driving the fan motor 18 is mounted on the opposite side surface of the control board 32.

The power module 38 is a high-heat-generating electric component which generates heat by operation thereof and increases the surrounding temperature. In order to cool the power module 38, a heat sink 39 for cooling is attached in close contact with the power module 38 as shown in FIG. 4B. The heat sink 39 is formed of a material of high thermal conductivity, such as aluminum.

As shown in FIG. 6, the heat sink 39 is composed of a heat sink base 39a which is rectangular in a plan view, and a heat sink projecting section 39b which is formed integrally with the heat sink base 39a and which is made of a plurality of fins projecting perpendicularly to the heat sink base 39a. The heat sink 39 is attached to the control board 32 by fixing the heat sink base 39a to the power module 38 by means of screws and the like.

As shown in FIG. 4B, a rectangular heat sink hole 31c is provided at the bottom plate 31b of the electric component box 31. In the state in which the control board 32 is attached to the electric component box 31, the heat sink 39 projects to the outside of the electric component box 31 from the heat sink hole 31c.

Further, as shown in FIG. 3, in the state in which the electric component box 31 is attached in the blower chamber 2, the heat sink 39 faces the suction port 20a of the fan casing 20, and the most part of the heat sink 39 is exposed in the blower chamber 2.

Since the most part of the heat sink hole 31c is closed by the heat sink 39, an amount of the air flowing into and out of the electric component box 31 through the heat sink hole 31c becomes small.

As shown in FIG. 6, a small gap S is formed between the heat sink 39 and the heat sink hole 31c. In order to close the gap S, a flame-retardant insulation paper 40 is disposed at a position opposing to the heat sink hole 31c in the electric component box 31. The insulation paper 40 includes a rectangular outer peripheral edge section larger than the heat sink hole 31c, and a rectangular inner peripheral edge section having the central portion into which the projecting section 39b of the heat sink 39 can be inserted with no gap. The insulation paper 40 is formed into a hollow square shape in a plan view. In the manner mentioned above, in which the insulation paper 40 is disposed at the heat sink hole 31c, the amount of the air passing through the heat sink hole 31c is further reduced, and it is thereby possible to prevent dust and water drop from entering the inside of the electric component box 31. Further, the insulation paper 40 is flame retardant, and hence, even if a fire occurs within the electric component box 31, the insulation paper 40 is hardly burned, and hence, the fire is not spread to the inside of the blower chamber 2 via the heat sink hole 31c. Examples of the material of the flame retardant insulation paper 40 include aramid paper and the like.

In the peripheral portion of the heat sink hole 31c provided in the bottom plate 31b of the electric component box 31, two cut-and-raised pieces 31d and 31d projecting in the same direction as the projecting direction of the heat sink 39 are provided so as to sandwich the heat sink 39 therebetween. The cut-and-raised pieces 31d and 31d are bent and formed according to the formation of the heat sink hole 31c and are formed integrally with the bottom plate 31b.

As shown in FIG. 6, the cut-and-raised pieces 31d and 31d are provided so as to have a size such that the projection direction length dimension L2 of the cut-and-raised pieces 31d and 31d is longer than the projection length dimension L1 of the heat sink 39 projecting from the electric component box 31.

Even in a case where, during the conveyance of the electric component box 31, during the assembly of the electric component box 31 into the main body 1, or during the maintenance or exchange of the electric component box 31, the electrical component box 31 is placed at a place, such as a work desk or a floor, (hereinafter referred to as work plane) in a state where the side of the bottom plate 31b with the heat sink 39 projecting therefrom is arranged on the lower side, the cut-and-raised pieces 31d and 31d are brought into contact with the work plane before the heat sink 39 is brought into contact with the work plane, so that the heat sink 39 and the power module 38 can be protected from a shock generated when the electric component box 31 is placed on the work plane. Thus, during the work or operation described above, the electric component box 31 can be easily handled, thereby improving the workability.

It should be noted that the number of the cut-and-raised pieces 31d and 31d is not restricted to two, and one or three or more of the cut-and-raised pieces 31d and 31d may be provided as long as the cut-and-raised pieces 31d and 31d can be formed integrally with the bottom plate 31b of the electric component box 31.

As shown in FIG. 4B and FIG. 6, similarly to the heat sink 39, a room temperature sensor holder 25, which holds and protects the room temperature sensor 24 described above, is mounted to the bottom plate 31b of the electric component box 31 so as to project to the outside of the electric component box 31.

The room temperature sensor holder 25 is a cylindrical resin-molded component formed with a plurality of vent holes.

It should be noted that, in order to prevent the room temperature sensor 24 from being affected by the heat of the heat sink 39, the room temperature sensor holder 25 is attached with a space apart from the heat sink 39.

As shown in FIG. 6, the room temperature sensor holder 25 is provided so that the projection direction length dimension L3 thereof is larger than the projection length dimension L1 of the heat sink 39 projecting from the electric component box 31.

Even in a case where, during the production of the electric component box 31 or during the maintenance or exchange of the electric component box 31, the electric component box 31 is placed on the work plane in a state where the side, from which the heat sink 39 projects, is disposed on the lower side, the room temperature sensor holder 25 is brought into contact with the work plane before the heat sink 39 is brought into contact with the work plane similarly to the cut-and-raised piece 31*d* described above. Thus, the heat sink 39 and the power module 38 can be protected from a shock generated when the electric component box 31 is placed on the work plane. Further, when the length dimension L3 of the room temperature sensor holder 25 is made larger than the length dimension L2 of the cut-and-raised piece 31*d*, the room temperature sensor holder 25 that is a resin-molded component is brought into contact with the work plane before the cut-and-raised piece 31*d* is brought into contact with the work plane, thereby reducing the shock generated by the contact as compared with the case where the metallic cut-and-raised piece 31*d* is brought into contact with the work plane before the room temperature sensor holder 25 is brought into contact with the work plane.

Hereunder, the operation of the built-in type air conditioner 100 having the structure described above will be explained.

When the built-in type air conditioner 100 is operated, and the blower 5 is then operated, air in the ceiling T is sucked into the blower chamber 2 from the air suction port 11 of the main body 1. The air is heat-exchanged by the heat exchanger 6 in the heat exchange chamber 3, and the heat-exchanged air is blown out from the air blow-out port 12 of the main body 1 and blown out from the ceiling blow-out port into the air-conditioned room R via the blow-out duct 15. At this time, a part of the air sucked into the blower chamber 2 cools the heat sink 39 exposed in the blower chamber 2. The air warmed by the heat sink 39 is mixed with the other air sucked into the blower chamber 2, and the mixed air is sucked from the suction port 20*a* of the fan casing 20 and is then discharged to the side of the heat exchange chamber 3.

According to the operation mentioned above, the air warmed by the heat sink 39 can be discharged to the outside of the blower chamber 2 without staying therein, and hence, the heat sink 39 can be efficiently cooled. Then, the power module 38, which drives the fan motor 18 and which becomes hottest in the electric component box 31, is cooled by the heat sink 39. Therefore, it is possible to prevent the temperature in the electric component box 31 from being increased and also prevent failure and malfunction of the electric component in the electric component box 31. As a result, the reliability of the built-in type air conditioner 100 can be improved.

Further, although the heat sink hole 31*c* is formed in the electric component box 31, the heat sink hole 31*c* is almost closed by the heat sink 39, and hence, the amount of the air flowing into and out of the electric component box 31 through the heat sink hole 31*c* becomes small. In addition, since the electric components in the electric component box 31 are cooled by the heat sink 39, it is not necessary to form any vent hole for cooling the inside of the electric component box other than the heat sink hole 31*c*. Accordingly, the inside of the electric component box 31 is almost closed, and hence, even if a fire occurs in the electric component box 31 due to a short circuit or a failure of an electric component, the fire can be effectively prevented from spreading into the blower chamber 2.

Particularly, in the case of a built-in type air conditioner whose main body is installed in the ceiling, the discovery of the spread of fire into the fan chamber 2 tends to be delayed, and accordingly, it is desired to prevent the fire from spreading. In this sense, the present embodiment is preferred.

As described above, according to the built-in type air conditioner 100 of the present embodiment, it is possible to efficiently cool the electric components accommodated in the electric component box 31 and it is also possible to prevent the fire from spreading from the electric component box 31.

Next, another embodiment according to the present invention will be described with reference to FIG. 7 to FIG. 9.

Figure 7:
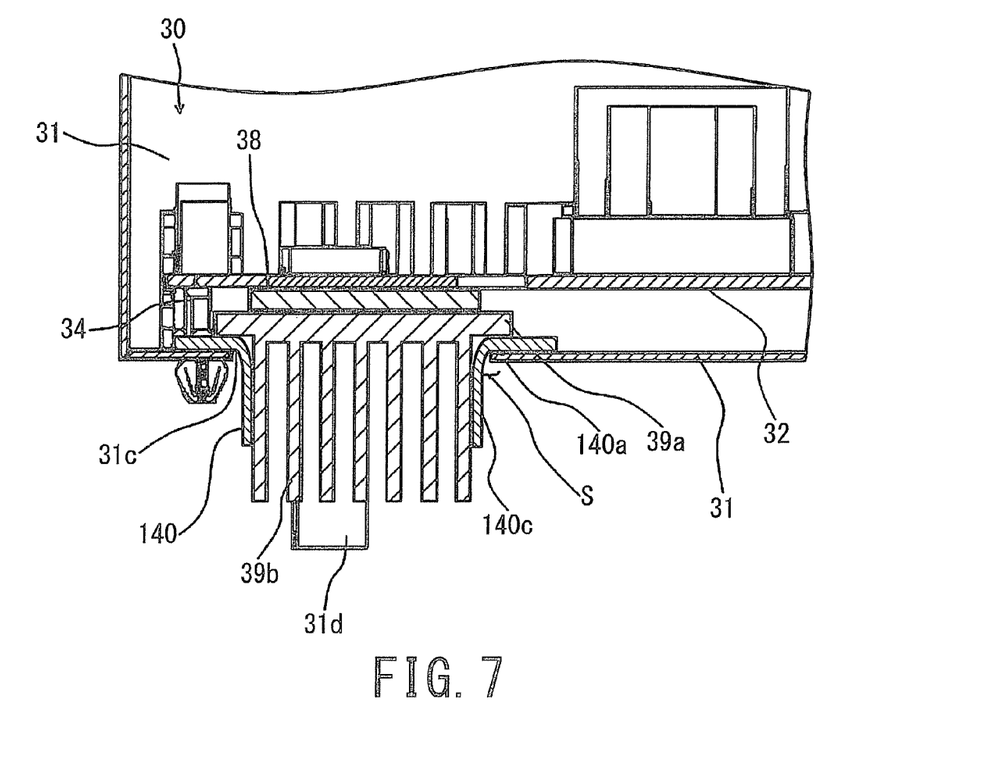
FIG. 7 is a schematic cross-sectional view also along the lateral direction of an electric component box of an electric equipment according to another embodiment of the present invention, and in particular, shows an enlarged partial sectional view corresponding to the cross-sectional view shown in FIG. 6.

FIG. 7 is a schematic cross-section taken along the lateral direction of an electric component box of an air conditioner according to another embodiment of the present invention.

It should be noted that the air conditioner according to the present embodiment is a built-in type air conditioner, the same structures or configurations as those shown in FIG. 1 to FIG. 5 are not shown, and the corresponding portions are denoted with the same reference numerals and characters as used on FIG. 1 to FIG. 5.

In the present embodiment, the electric component box 31 is also formed by bending a metal thin plate, and is formed, as shown in FIG. 4, into a box body shape which includes the opening section 31*a* formed in the front surface, the bottom plate 31*b* formed so as to oppose to the opening section 31*a*, and side plates formed at upper and lower side portions and left and right side portions of the bottom plate 31*b*, respectively.

As shown in FIG. 3, the electric component box 31 is arranged at the inner surface side of the side surface plate 1*c* constituting the main body 1 so as to oppose to the suction port 20*a* provided in the fan casing 20 in the blower chamber 2.

On the other hand, as shown in FIG. 5A, the maintenance opening section 22 for maintenance is formed in the side surface plate 1*c* of the main body 1. As shown in FIG. 5B, from the outside of the main body 1, the maintenance opening section 22 is usually covered with the cover 23 made of a metal thin plate. Dust or like is prevented by the cover 23 from entering the inside of the electric component box 31, and the airtightness in the electric component box 31 is maintained. When it becomes necessary to perform the maintenance of the electric component box 31 from the outside of the main body 1, the cover 23 in FIG. 5B is removed and the maintenance work is then performed.

The operation described above is the same as that of the embodiment shown in FIG. 1 to FIG. 6.

As shown in FIG. 4B and FIG. 6, the control board 32 is attached to the inner side of the bottom plate 31*b* of the electric component box 31 by the fixing member 34 of a resin-molded component also serving as a spacer. The control board 32 is attached to the bottom plate 31*b* via a predetermined gap which is provided in order to maintain an insulation distance between the control board 32 and the bottom plate 31*b*.

The present embodiment is different from the above-described embodiment mainly in that a sheet material 140, described hereinafter, having an insulating function is provided in place of the insulation paper 40 provided at and in the vicinity of the heat sink 39.

That is, as described above, the rectangular heat sink hole 31c is formed in the bottom plate 31b of the electric component box 31 as shown in FIG. 4B, and in the state where the control board 32 is attached to the electric component box 31, the heat sink 39 is arranged so as to project outside of the electric component box 31 from the heat sink hole 31c. Furthermore, as shown in FIG. 3, in the state where the electric component box 31 is attached in the blower chamber 2, the heat sink 39 faces the suction port 20a of the fan casing 20, and the most part of the heat sink 39 is exposed in the blower chamber 2.

Since the most part of the heat sink hole 31c is closed by the heat sink 39, the amount of the air flowing into and out of the electric component box 31 through the heat sink hole 31c becomes small.

In the present embodiment, as shown in FIG. 7, the small gap S is formed between the heat sink 39 and the heat sink hole 31c, and in order to close the gap S, the sheet material 140 is disposed at a position facing the heat sink hole 31c in the electric component box 31. The sheet material 140, which has a large surface friction coefficient and is elastically deformable, is formed of a flame-retardant material, such as, for example, aramid paper.

Figure 8:
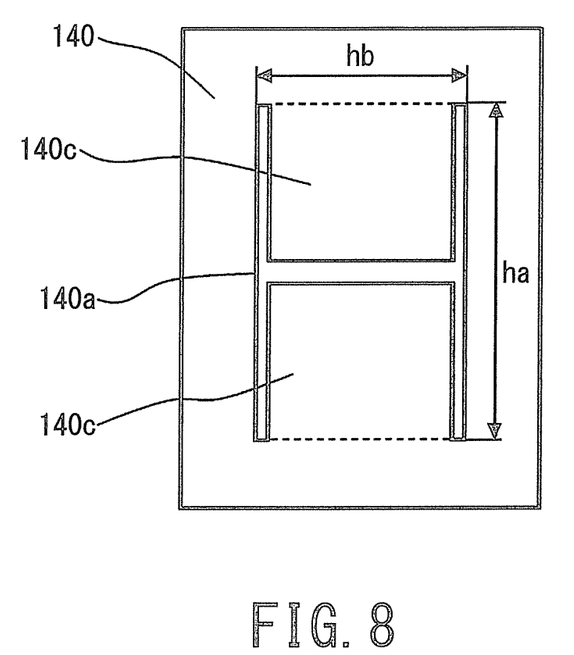
FIG. 8 is a schematic front view of a sheet material accommodated in the electric equipment in another embodiment shown in FIG. 7.

FIG. 8 shows the sheet material 140 in a state where the sheet material 140 is not incorporated in the electric equipment 30.

The sheet material 140 is provided with a rectangular outer peripheral edge section larger than the heat sink hole 31c, and an H-shaped slit 140a formed at the central portion. The slit 140a is composed of two linear slits extending in the longitudinal direction, and one slit mutually connecting the central portions of the two linear slits in the lateral direction.

The slit 140a has a longitudinal dimension ha equal to or larger than the length in the longitudinal direction of the heat sink 39, and a lateral dimension hb substantially equal to or slightly larger than the length of the short side direction of the heat sink. Further, the longitudinal dimension ha and the lateral dimension hb are set to be small enough to fit in the heat sink hole 31c of the electric component box 31.

Two convex sections 140c and 140c surrounded by the two slits extending in the longitudinal direction and the one slit extending in the lateral direction are formed to be elastically deformable in the projecting direction of the projecting section 39b of the heat sink 39 at the time when the projecting section 39b is inserted into the sheet material 140. The proximal end portion of each of the two convex sections 140c and 140c is provided with a foldable (folded) line (shown by a broken line in FIG. 8) and is formed to be easily elastically deformed.

Figure 9A:
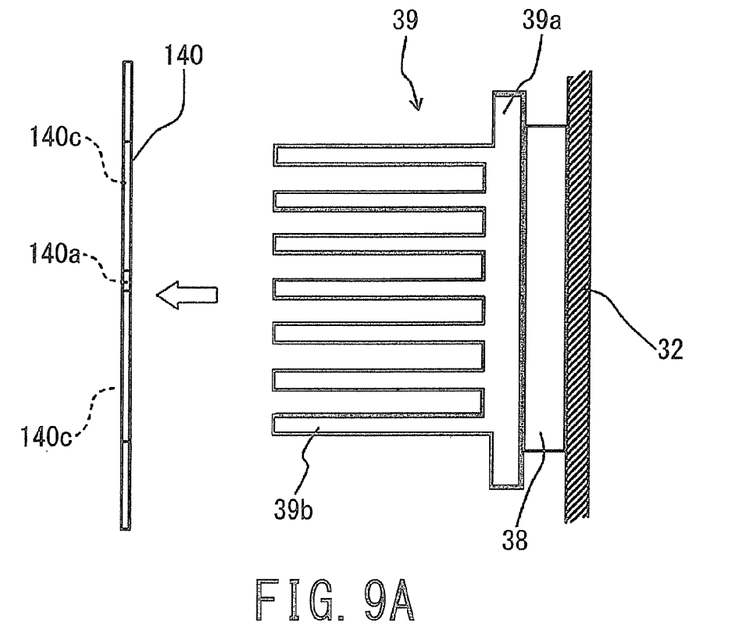
FIG. 9 is a view showing a state in which the sheet material is assembled with the heat sink of the electric equipment shown in FIG. 7, and includes FIG. 9A and FIG. 9B respectively showing different forms.
Figure 9B:
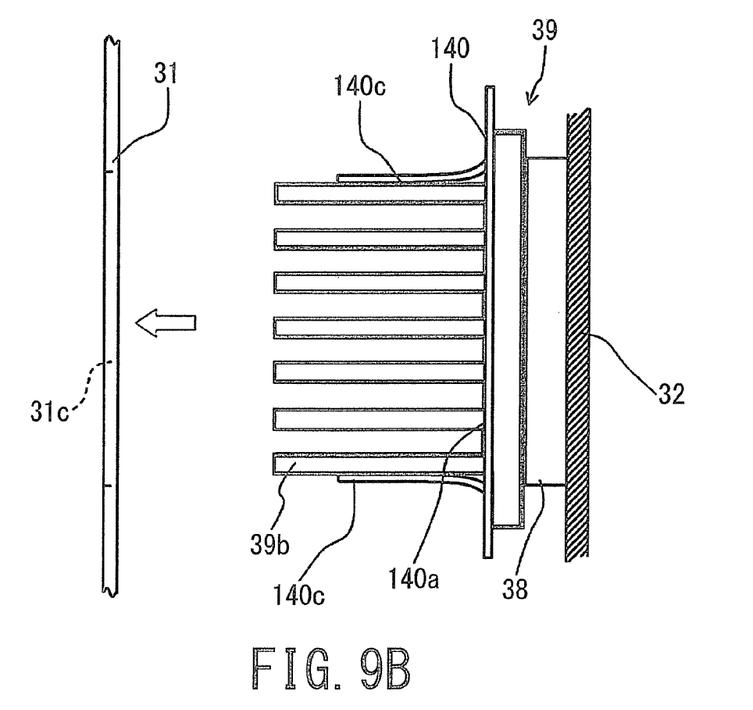

FIG. 9A and FIG. 9B show states in which the sheet material 140 is assembled into the electric equipment 30.

As shown in FIG. 9A, in the process of assembling the electric equipment 30, the projecting section 39b of the heat sink 39 is inserted into the H-shaped slit 140a of the sheet material 140, so that, as shown in FIG. 9B, the sheet material 140 takes a state in which the projecting section 39b of the heat sink 39 is arranged so as to project from the sheet material 140. Thus, the convex sections 140c and 140c are elastically deformed toward the projecting direction of the projecting section 39b along the heat dissipation fins which are located on the longitudinally outermost sides of the projecting section 39b of the heat sink 39.

Accordingly, at the central portion of the sheet material 140, the opening section 140a is formed in a portion surrounded by the two slits extending in the longitudinal direction and the foldable lines (broken lines) in FIG. 9. The elastically deformed convex sections 140c and 140c are pushed against the projecting section 39b of the heat sink 39, and the sheet material 140 is engaged with to the heat sink 39 by the surface frictional force.

After the sheet material 140 is engaged with the heat sink 39 as described above, the control board 32 is accommodated in the electric component box 31 while the projecting section 39b of the heat sink 39 and the elastically deformed convex section 140c of the sheet material 140 are inserted into the heat sink hole 31c of the electric component box 31. Further, as shown in FIG. 7, the gap S between the heat sink 39 and the electric component box 31 is closed by the sheet material 140.

As described above, the sheet material 140 is engaged with the heat sink 39, and then the control board 32 is assembled to the electric component box 31. Accordingly, even in the case where the assembly work is performed by inclining the control board 32 or by turning the control board 32 upside down, the sheet material 140 engaged with the projecting section 39b of the heat sink 39 does not shift or fall off. In this way, the work of assembling the control board 32 to the electric component box 31 can be easily performed in the state where the sheet material 140 is provided between the heat sink 39 and the inner surface of the electric component box 31, and between the control board 32 and the inner surface of the electric component box 31.

Furthermore, since the gap S between the heat sink 39 and the electric component box 31 is closed by the sheet material 140, the amount of air passing through the heat sink hole 31c is further reduced, and hence, the dust and water drop can be prevented from entering the electric component box 31. Moreover, since the sheet material 140 is flame retardant, even in an occurrence of a fire in the electric component box 31, the sheet material 140 is not easily burned, and hence, the fire does not spread into the blower chamber 2 through the heat sink hole 31c.

Furthermore, even in the case where the electric component box 31 is opened to remove the control board during the maintenance or the replacement, the sheet material 140 is engaged with the heat sink 39 by the elastically deformed convex section 140c. Therefore, the falling off of the sheet material 140 is prevented, thereby improving the workability of the maintenance or the replacement of the electric equipment 30.

The workability during the conveyance of the electric component box 31, the workability during the assembly of the electric component box 31 into the main body 1, and the workability during the maintenance or the replacement of the electric component box 31 are the same as those of the afore-mentioned embodiment, and hence, the description thereof is omitted herein.

Further, the operation of the built-in type air conditioner 100 according to the present embodiment is the same as that of the afore-mentioned embodiment, and hence, the description thereof is omitted herein.

In the described embodiment, although the H-shaped slit is provided in the sheet material 140 used, slits of various shapes may be used as long as the sheet material 140 has a shape formed such that the sheet material 140 can be engaged with or locked to the heat sink 39 by the convex section 140c, and the gap between the heat sink 39 and the electric component box 31 can be closed by the sheet material 140.

As a further embodiment, the present invention provides an air conditioner provided with an electric equipment having the cooling structure described above.

As shown in FIG. 1, an air conditioner according to this embodiment includes the main body 1, the inside of which is partitioned into the blower chamber 2 and the heat exchange chamber 3 by the partition plate 4. The blower 5 is disposed in the blower chamber 2 and the heat exchanger 6 is disposed in the heat exchange chamber 3. The air conditioner is provided with the electric equipment provided with the component box 31 disposed in the blower chamber 2, in which there are disposed the electric component control board 32, a heat-generating electric component, the heat sink 39 thermally connected with the electric component, and the sheet material 140 provided between the electric component box 31 and the control board 32.

In the electric equipment of the air conditioner, as described above, the sheet material 140 is made of an elastic material and has an opening section allowing the heat sink 39 to project through the opening section. The opening section is provided with a convex section which is formed integrally with the sheet material, and which is elastically deformed to engage or lock the sheet material to the heat sink. Further, the electric component box is featured by including a heat sink hole so as to project the heat sink and the convex section outside of the electric component box.

In the above description, the embodiments according to the present invention have been described. These embodiments are presented as examples and are not intended to limit the scope of the invention. These novel embodiments can be implemented in other various forms, and various abbreviations, substitutions, and changes may be made within the scope not deviating from the subject of the invention. These embodiments and their modifications are included in the scope and the subject of the invention, and are included in the inventions recited in the patent claims and the equivalent scope thereof.

REFERENCE NUMERAL

1 - - - main body, 2 - - - blower chamber, 3 - - - heat exchanger chamber, 4 - - - partition plate, 5 - - - blower, 6 - - - heat exchanger, 20 - - - fan casing, 20a - - - suction port, 22 maintenance opening, 25 - - - room temperature sensor holder, 31 - - - electric component box, 31c - - - heat sink hole, 31b - - - raised piece, 32 - - - control board, 33 - - - terminal block, 38 - - - power module, 39 - - - heat sink, 40 - - - insulation paper, 140 - - - sheet material, 140a - - - opening section, 140c - - - convex section.

The invention claimed is:

1. An air conditioner comprising:
a blower comprising a fan configured to suck air from a shaft direction on an inlet side and blow the air out in a circumferential direction on an outlet side;
a heat exchanger;
an electric component box comprising a heat sink attached at a position opposing the blower and a heat sink hole through which the heat sink projects outward of the electric component box, wherein the electric component box and the heat sink are arranged upstream of the heat exchanger and face the inlet side of the fan.

2. The air conditioner according to claim 1, wherein the electric component box is formed with a cut-and-raised piece having a projection length larger than a projection length of the heat sink at a peripheral portion of the heat sink hole.

3. The air conditioner according to claim 1, wherein the electric component box comprises, on a surface in which the heat sink hole is formed, a resin molded-component having a projection length larger than a projection length of the heat sink.

4. The air conditioner according to claim 1, wherein the air conditioner is a built-in type air conditioner.

5. An electric equipment comprising:
an electric component box, the electric component box comprising a heat sink hole;
a control board accommodated in the electric component box and comprising a heat-generating electric component;
a heat sink thermally connected with the electric component; and
a sheet material made of an elastic material provided between the electric component box and the control board, the sheet material comprising an opening section through which the heat sink projects outward, the opening section comprising a convex section formed integrally with the sheet material and configured to be elastically deformed to engage the sheet material with the heat sink,
wherein the heat sink and the convex section project outward of the electric component box through the heat sink hole, and a gap between the heat sink and the electric component box is closed by the sheet material.

6. The electric equipment according to claim 5, wherein an H-shaped slit is formed in a position of the opening section of the sheet material in a state before the sheet material is assembled into the electric equipment.

7. The electric equipment according to claim 5, wherein the sheet material is formed of a flame-retardant material which has a large surface friction coefficient and is elastically deformable.

8. The electric equipment according to claim 7, wherein the sheet material is an aramid paper.

9. An air conditioner comprising:
a main body comprising an inner space partitioned into a blower chamber and a heat exchange chamber by a partition plate;
a fan provided in the blower chamber;
a heat exchanger provided in the heat exchange chamber;
an electric component box provided in the blower chamber; and
an electric equipment comprising a control board disposed in the electric component box and comprising a heat-generating electric component, a heat sink thermally connected with the electric component, and a sheet material disposed between the electric component box and the control board and closing a gap between the heat sink and the electric component box.

* * * * *